(12) United States Patent
Sato et al.

(10) Patent No.: US 8,895,223 B2
(45) Date of Patent: Nov. 25, 2014

(54) RADIATION-SENSITIVE RESIN COMPOSITION

(75) Inventors: Mitsuo Sato, Tokyo (JP); Kazuo Nakahara, Tokyo (JP); Hiromitsu Nakashima, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/427,952

(22) Filed: Mar. 23, 2012

(65) Prior Publication Data

US 2012/0219903 A1 Aug. 30, 2012

Related U.S. Application Data

(63) Continuation of application No. PCT/JP2010/065771, filed on Sep. 13, 2010.

(30) Foreign Application Priority Data

Sep. 24, 2009 (JP) ................................. 2009-219745

(51) Int. Cl.
*G03F 7/004* (2006.01)
*G03F 7/039* (2006.01)

(52) U.S. Cl.
CPC ............ *G03F 7/0397* (2013.01); *G03F 7/0045* (2013.01)
USPC ..................................... 430/270.1; 430/281.1

(58) Field of Classification Search
None
See application file for complete search history.

(56) References Cited

U.S. PATENT DOCUMENTS

| | | | | |
|---|---|---|---|---|
| 2008/0044760 A1* | 2/2008 | Iwato et al. | ................. | 430/270.1 |
| 2009/0202946 A1* | 8/2009 | Yamashita | ................. | 430/286.1 |

FOREIGN PATENT DOCUMENTS

| | | |
|---|---|---|
| JP | 05-158239 | 6/1993 |
| JP | 05-232706 | 9/1993 |
| JP | 05-249683 | 9/1993 |
| JP | 11-052575 | 2/1999 |
| JP | 11-084660 | 3/1999 |
| JP | 2000-066382 | 3/2000 |
| JP | 3052292 B2 * | 6/2000 |
| JP | 2001-166476 | 6/2001 |
| JP | 2001-215689 | 8/2001 |
| JP | 2005-010217 | 1/2005 |
| JP | 2006-227632 | 8/2006 |
| WO | WO 2005/069076 | 7/2005 |
| WO | WO 2006/035790 | 4/2006 |

OTHER PUBLICATIONS

Machine translation of JP3052292, Jun. 12, 2000.*
International Search Report for corresponding International Application No. PCT/JP2010/065771, Oct. 26, 2010.

* cited by examiner

*Primary Examiner* — Cynthia H Kelly
*Assistant Examiner* — Alyssa L Cepluch
(74) *Attorney, Agent, or Firm* — Oblon, Spivak, McClelland, Maier & Neustadt, L.L.P.

(57) ABSTRACT

The radiation-sensitive resin composition includes a compound represented by a following formula (1), and a resin. The resin has an acid-dissociable group, is insoluble or hardly soluble in an alkali, and turns to be soluble in an alkali when the acid-dissociable group is dissociated. R represents a hydrogen atom or a hydrocarbon group having 1 to 20 carbon atoms, $R^1$ represents a hydrocarbon group having 1 to 20 carbon atoms or the like, $R^2$ to $R^5$ each independently represent an alkyl group having 1 to 4 carbon atoms, an alicyclic hydrocarbon group having 4 to 20 carbon atoms, or the like, and $R^6$ represents a halogen atom or the like.

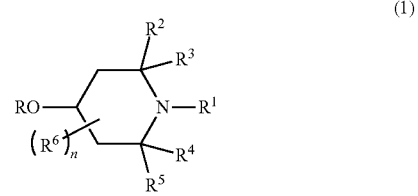

(1)

4 Claims, No Drawings

RADIATION-SENSITIVE RESIN COMPOSITION

CROSS-REFERENCE TO RELATED APPLICATIONS

The present application is a continuation application of International Application No. PCT/JP2010/065771, filed Sep. 13, 2010, which claims priority to Japanese Patent Application No. 2009-219745, filed Sep. 24, 2009. The contents of these applications are incorporated herein by reference in their entirety.

BACKGROUND OF THE INVENTION

1. Field of the Invention

The present invention relates to a radiation-sensitive resin composition.

2. Discussion of the Background

Chemically amplified radiation-sensitive resin compositions generate an acid upon irradiation with an electron beam or far ultraviolet ray typified by KrF excimer laser or ArF excimer laser at a light-exposed site, and a chemical reaction that proceeds with the acid as a catalyst allows the difference in dissolution rates in developing solutions to be produced between the light-exposed site and the light-unexposed site, thereby enabling resist patterns to be formed on the substrate.

For example, as lithography materials for ArF excimer laser that enable microfabrication with light at shorter wavelengths, a resin composition containing as a constitutional component a polymer having in the skeleton an alicyclic hydrocarbon that does not exhibits significant absorption in the area of 193 nm, particularly a polymer having a lactone skeleton in the structure unit has been used.

A nitrogen-containing compound is added to the radiation-sensitive resin composition as described above for the purpose of attaining process stability (see Japanese Unexamined Patent Application, Publication Nos. H5-232706, H5-249683 and H5-158239). In addition, for particularly improving lithographic performance of independent patterns, addition of a nitrogen compound having a specific carbamate group has been also studied (see Japanese Unexamined Patent Application, Publication Nos. 2001-166476 and 2001-215689).

However, according to the current situation in which miniaturization of the resist pattern advances to a level of line widths being no greater than 90 nm, not only just improvement of fundamental characteristics such as improvement of resolving ability, expansion of focus latitude and exposure latitude (EL), and improvement of rectangularity of the pattern, but also other performance have been demanded. For example, as one of miniaturization techniques of the resist pattern at present, putting liquid immersion lithography into practical applications has been promoted, and a resist material being applicable also to the liquid immersion lithography has been demanded. Specifically, development of a material that satisfies demand characteristics such as an improvement of MEEF (Mask Error Enhanced Factor) that is a marker representing mask error tolerance has been desired.

SUMMARY OF THE INVENTION

According to one aspect of the present invention, a radiation-sensitive resin composition includes a compound represented by a following formula (1), and a resin. The resin has an acid-dissociable group, is insoluble or hardly soluble in an alkali, and turns to be soluble in an alkali when the acid-dissociable group is dissociated.

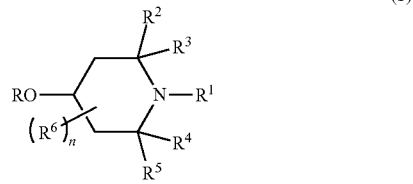

(1)

In the formula (1), R represents a hydrogen atom or a hydrocarbon group having 1 to 20 carbon atoms. $R^1$ represents a hydrocarbon group having 1 to 20 carbon atoms, and optionally an ester bond or an ether bond is included in a skeleton chain of the hydrocarbon group. The hydrocarbon group represented by $R^1$ is unsubstituted, or at least one of hydrogen atoms of the hydrocarbon group represented by $R^1$ is substituted. $R^2$ to $R^5$ each independently represent an alkyl group having 1 to 4 carbon atoms or an alicyclic hydrocarbon group having 4 to 20 carbon atoms. The alkyl group is unsubstituted, or at least one of hydrogen atoms of the alkyl group is substituted. The alicyclic hydrocarbon group is unsubstituted, or at least one of hydrogen atoms of the alicyclic hydrocarbon group is substituted. $R^6$ represents a halogen atom or a hydrocarbon group having 1 to 6 carbon atoms. n is an integer of 0 to 4. In a case where n is an integer of 2 to 4, $R^6$ present in a plurality of numbers are each a same or different.

DESCRIPTION OF THE EMBODIMENTS

According to one embodiment of the present invention, a radiation-sensitive resin composition includes (A) a compound represented by the following formula (1), and (B) a resin that has an acid-dissociable group and is insoluble or hardly soluble in an alkali, and that turns to be soluble in an alkali when the acid-dissociable group is dissociated.

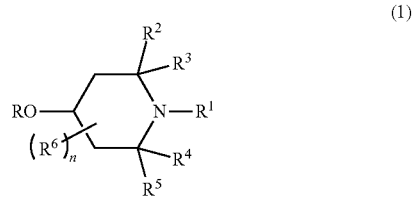

(1)

In the formula (1), R represents a hydrogen atom or a hydrocarbon group having 1 to 20 carbon atoms; $R^1$ represents a hydrocarbon group having 1 to 20 carbon atoms, and an ester bond or an ether bond may be included in a skeleton chain of the hydrocarbon group; wherein, a part or all of hydrogen atoms of the hydrocarbon group represented by $R^1$ may be substituted; $R^2$ to $R^5$ each independently represent an alkyl group having 1 to 4 carbon atoms or an alicyclic hydrocarbon group having 4 to 20 carbon atoms; wherein, apart or all of hydrogen atoms of the alkyl group or the alicyclic hydrocarbon group may be substituted; $R^6$ represents a halogen atom or a hydrocarbon group having 1 to 6 carbon atoms; n is an integer of 0 to 4; and in a case where n is an integer of 2 to 4, $R^6$ present in a plurality of numbers may be the same or different.

The compound (A) is represented by the above formula (1), and has great steric hindrance in the vicinity of a basic amino group. Therefore, during post exposure baking after the exposure, the compound (A) suitably serves as a base in the resist film, and enables lithography performance to be improved.

In the compound (A), it is preferred that R in the above formula (1) represents a hydrogen atom, and n is 0.

Due to having a hydroxyl group, the compound (A) is less likely to evaporate from the surface layer of the resist even during the post exposure baking after the exposure, whereby the pattern configuration can be improved.

In the compound (A), it is preferred that $R^2$ to $R^5$ in the above formula (1) each represent a methyl group.

The resin (B) preferably has a structure unit (I) represented by the following formula (2).

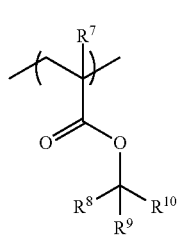

(2)

In the formula (2), $R^7$ represents a hydrogen atom or a methyl group; $R^8$ to $R^{10}$ each independently represent an alkyl group having 1 to 4 carbon atoms or an alicyclic hydrocarbon group having 4 to 20 carbon atoms; and wherein, $R^9$ and $R^{10}$ may bind with each other to form a bivalent alicyclic hydrocarbon group having 4 to 20 carbon atoms together with the carbon atom to which $R^9$ and $R^{10}$ are bound.

It is preferred that the radiation-sensitive resin composition of the embodiment of the present invention further includes (C) a radiation-sensitive acid generator (hereinafter, may be also referred to as "(C) acid generator").

The radiation-sensitive resin composition according to the embodiment of the present invention is superior in sensitivity, and can be suitably used as a material for chemical amplified resists that can exhibit satisfactory exposure latitude (EL) as well as MEEF performance.

The radiation-sensitive resin composition of the embodiment of the present invention is useful in manufacturing process of semiconductors such as IC, production process of circuit boards of liquid crystals, thermal heads etc, as well as other photolithography process, and the like. More specifically, The radiation-sensitive resin composition of the embodiment of the present invention relates to a chemically amplified radiation-sensitive resin composition that can be suitably used in photolithography process which is carried out using an exposure light source for electron beams as well as far ultraviolet rays with wavelengths of no greater than 250 nm such as KrF excimer laser and ArF excimer laser, and the like.

Hereinafter, Description of Embodiments of the present invention is explained, but the present invention is not limited to the following Embodiments.

The radiation-sensitive resin compound of the embodiment of the present invention contains (A) a compound and (B) a resin. In addition, as a suitable component, (C) an acid generator may be included. Furthermore, (D) a solvent or other optional components (a fluorine-containing resin, an alicyclic skeleton-containing compound, a surfactant or a sensitizer) may be included within the range so as not to deteriorate intended effects of the present invention.

<(A) Compound>

Due to having great steric hindrance in the vicinity of a basic amino group, the compound (A) suitably serves as a base in a resist film during post exposure baking after the exposure, whereby lithography performance can be improved.

In the above formula (1), R represents a hydrogen atom or a hydrocarbon group having 1 to 20 carbon atoms; $R^1$ represents a hydrocarbon group having 1 to 20 carbon atoms, and an ester bond or an ether bond may be included in a skeleton chain of the hydrocarbon group; wherein, a part or all of hydrogen atoms of the hydrocarbon group represented by $R^1$ may be substituted; $R^2$ to $R^5$ each independently represent an alkyl group having 1 to 4 carbon atoms or an alicyclic hydrocarbon group having 4 to 20 carbon atoms; and wherein, a part or all of hydrogen atoms of the alkyl group or the alicyclic hydrocarbon group may be substituted; $R^6$ represents a halogen atom or a hydrocarbon group having 1 to 6 carbon atoms; n is an integer of 0 to 4; and in a case where n is an integer of 2 to 4, $R^6$ present in a plurality of numbers may be the same or different.

R represents a hydrogen atom or a hydrocarbon group having 1 to 20 carbon atoms. Of these, a hydrogen atom is preferred.

Examples of the hydrocarbon group having 1 to 20 carbon atoms represented by R include linear or branched hydrocarbon groups such as a methyl group, an ethyl group, a propyl group, a butyl group, a pentyl group, a hexyl group, a heptyl group, an octyl group, a nonyl group and a decyl group;

alicyclic hydrocarbon groups having 3 to 20 carbon atoms such as a cyclobutyl group, a cyclopentyl group, a cyclohexyl group, a cyclooctyl group, a norbornyl group, a tricyclodecyl group, a tetracyclododecyl group and an adamantyl group;

aryl groups having 6 to 20 carbon atoms such as a phenyl group and a naphthyl group;

aralkyl groups having 7 to 20 carbon atoms such as a benzyl group, a phenylethyl group, a phenylpropyl group, a naphthylmethyl group and a naphthylethyl group, and the like. Of these groups, those having 1 to 7 carbon atoms are preferred.

The hydrocarbon group having 1 to 20 carbon atoms represented by $R^1$ may be exemplified by similar hydrocarbon groups having 1 to 20 carbon atoms to those represented by R as illustrated above. Of these, the hydrocarbon groups having 1 to 7 carbon atoms group are preferred.

Examples of the hydrocarbon group having 1 to 4 carbon atoms represented by $R^2$ to $R^5$ include linear or branched alkyl groups such as a methyl group, an ethyl group, a propyl group and a butyl group. Of these groups, a methyl group is preferred. Examples of the alicyclic hydrocarbon group having 4 to 20 carbon atoms include alicyclic hydrocarbon groups such as a cyclobutyl group, a cyclopentyl group, a cyclohexyl group, a cyclooctyl group, a norbornyl group, a tricyclodecyl group, a tetracyclododecyl group and an adamantyl group.

A part or all of hydrogen atoms of the group represented by $R^1$ and $R^2$ to $R^5$ may be substituted. The substituent may be a hydrocarbon group, a hydroxyl group, a carboxyl group, an alkylcarbonyl group, an arylcarbonyl group, an alkoxycarbonyl group, a nitro group, an amino group, a silyl group, a halogen atom, a thienyl group, or the like.

$R^6$ represents a halogen atom or a hydrocarbon group having 1 to 6 carbon atoms. Examples of the hydrocarbon group having 1 to 6 carbon atoms represented by $R^6$ include a methyl group, an ethyl group, a propyl group, a butyl group, a pentyl group, a hexyl group, and the like. "n" indicating the number of substituents represented by $R^6$ is an integer of 0 to 4, and is preferably 0.

Due to having a hydroxyl group, the compound (A) according to the foregoing preferred embodiment is less likely to be evaporated from the surface layer of the resist even during post exposure baking after the exposure, and thus the pattern configuration can be improved. This effect is remarkable as compared with conventional amine compounds only having controlled basicity.

A commercially available product may be used as the compound (A), and for example, 4-hydroxy-1,2,2,6,6-pentamethylpiperidine and 4-hydroxy-1-benzyl-2,2,6,6-pentamethylpiperidine (both manufactured by Aldrich Co.), 4-hydroxy-1-(2-hydroxyethyl)-2,2,6,6-tetramethylpiperidine (manufactured by Tokyo Chemical Industry Co., Ltd.) may be included. Of these, 4-hydroxy-1,2,2,6,6-pentamethylpiperidine is preferred.

The compound (A) may be used either alone, or as a mixture of two or more thereof. The amount of the compound (A) included is usually 0.01 to 20 parts by mass, and preferably 0.1 to 10 parts by mass with respect to 100 parts by mass of the resin (B). When the amount of the compound (A) is less than 0.01 parts by mass, the basicity in the resist film lacks, whereby the pattern is likely to be thinned. On the other hand, when the amount of the compound (A) exceeds 20 parts by mass, developability of the coated film may be deteriorated.

In addition, the compound (A) may be used as a mixture with other nitrogen-containing compound such as a tertiary amine compound or a quaternary ammonium hydroxide compound.

Examples of the tertiary amine compound include tri(cyclo)alkylamines such as triethylamine, tri-n-propylamine and tri-n-butylamine; aromatic amines such as aniline, N-methylaniline and N,N-dimethylaniline; alkanolamines such as triethanolamine, N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, bis(2-dimethylaminoethyl)ether, bis(2-diethylaminoethyl)ether, and the like.

Also, examples of the quaternary ammonium hydroxide compound include tetra-n-propylammonium hydroxide, tetra-n-butylammonium hydroxide, and the like.

The proportion of the other nitrogen-containing compound used is usually 0 to 50% by mass with respect to the total amount of the compound (A) and the other nitrogen-containing compound.

<(B) Resin>

The resin in the used in the embodiment of the present invention is a resin that has an acid-dissociable group and is insoluble or hardly soluble in an alkali, and that turns to be soluble in an alkali when the acid-dissociable group is dissociated. It is to be noted that the phrase "insoluble or hardly soluble in an alkali" as referred to herein means to have a property that in a case in which a film produced using only the resin (B) is developed in place of a resist film under alkali development conditions employed when resist patterns are formed from the resist film which had been formed with the radiation-sensitive resin composition, no less than 50% of the initial film thickness of the film remains after the development.

The resin (B) preferably has the structure unit (I) represented by the above formula (2).

The alkyl group having 1 to 4 carbon atoms represented by $R^8$ to $R^{10}$ in the above formula (2) may include a methyl group, an ethyl group, a n-propyl group, a n-butyl group, and the like. With respect to the alicyclic hydrocarbon group having 4 to 20 carbon atoms, or the alicyclic hydrocarbon group having 4 to 20 carbon atoms formed by binding of $R^9$ and $R^{10}$ with each other together with the carbon atom to which $R^9$ and $R^{10}$ are bound, similar ones to illustrative examples of the alicyclic hydrocarbon groups having 4 to 20 carbon atoms represented by $R^2$ to $R^5$ described above may be exemplified.

As the structure unit (I) represented by the above formula (2), preferred examples include those represented by the following formulae.

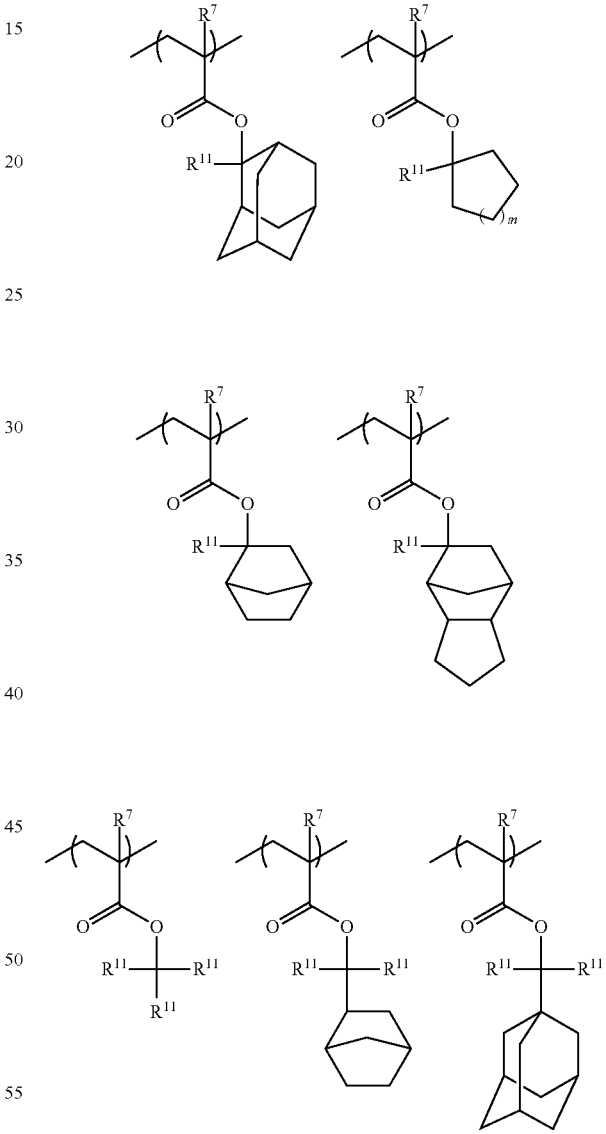

In the above formula, $R^7$ is similarly defined to that in the above formula (2); $R^{11}$ represents an alkyl group having 1 to 4 carbon atoms; and m is an integer of 1 to 6.

In particular, structure units represented by the following formulae (2-1) to (2-18) are more preferred, and the structure units represented by the following formulae (2-3), (2-4), (2-9) and (2-12) are particularly preferred. In the resin (B), the structure unit (I) may be included either alone, or two or more thereof may be included.

(2-1)
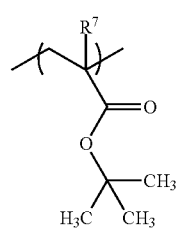
(2-2)
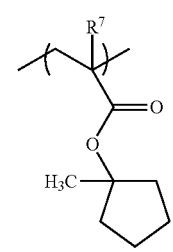
(2-3)
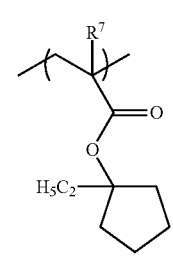
(2-4)
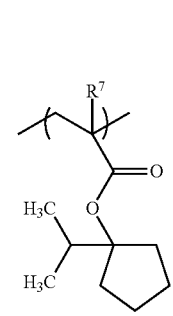
(2-5)
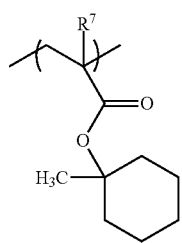
(2-6)
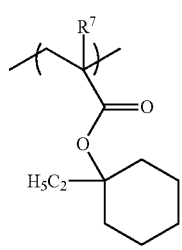
-continued
(2-7)
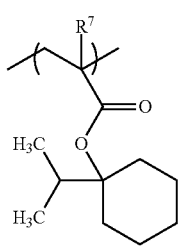
(2-8)
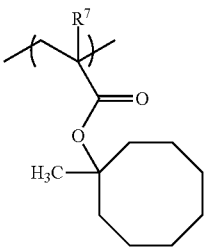
(2-9)
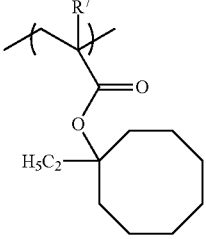
(2-10)
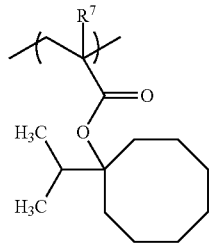
(2-11)
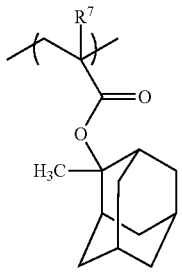
(2-12)
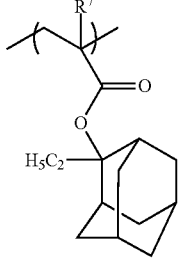

(2-13) 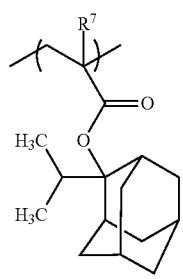

(2-14) 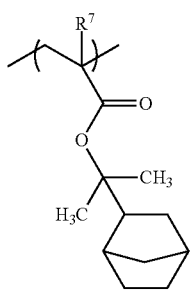

(2-15) 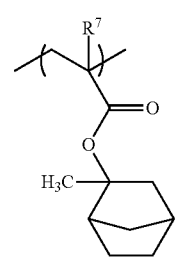

(2-16) 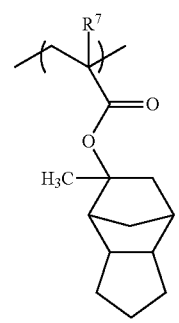

(2-17) 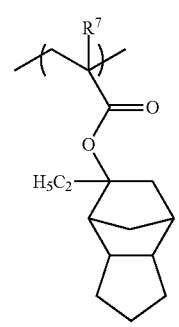

(2-18) 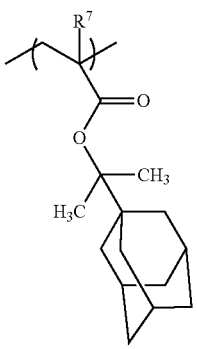

In the above formula, $R^7$ is similarly defined to that in the above formula (2).

In the resin (B), the proportion of the structure unit (I) included is preferably 5 to 80% by mole and still more preferably 10 to 80% by mole with respect to the entire repeating units constituting the resin (B), and 20 to 70% is particularly preferred. When the proportion of the structure unit (I) contained exceeds 80% by mole, the adhesiveness of the resist film decreases, and thus pattern collapse and pattern peeling may occur.

The resin (B) preferably further includes at least one or more types of a structure unit (II) having a lactone skeleton or a cyclic carbonate skeleton represented by the following formulae.

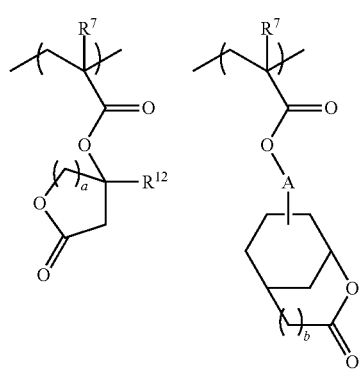

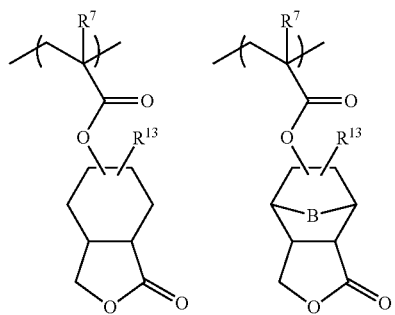

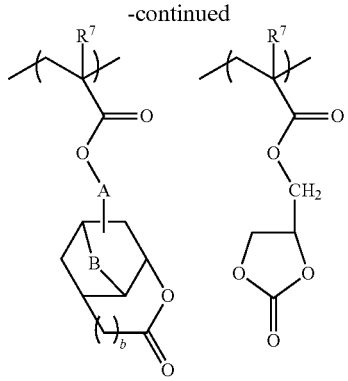

In the above formula, $R^7$ is similarly defined to that in the above formula (2); $R^{12}$ represents a hydrogen atom or a methyl group; $R^{13}$ represents a hydrogen atom or a methoxy group; A represents a single bond or a methylene group; B represents a methylene group or an oxygen atom; and a and b is 0 or 1.

As the structure unit (II), structure units represented by the following formulae are particularly preferred.

In the above formula, $R^7$ is similarly defined to that in the above formula (2).

In the resin (B), the proportion of the structure unit (II) included is preferably 0 to 70% by mole, and more preferably 10 to 60% by mole with respect to the entire structure units that constitute the resin (B). By adjusting the proportion to fall within such a range, developability and LWR as a resist can be improved, and betterment of defectiveness and low PEB temperature dependency is enabled. On the other hand, when the proportion exceeds 70% by mole, resolving ability and LWR as a resist may be deteriorated.

In addition, the resin (B) may further include a structure unit represented by any of the following formulae.

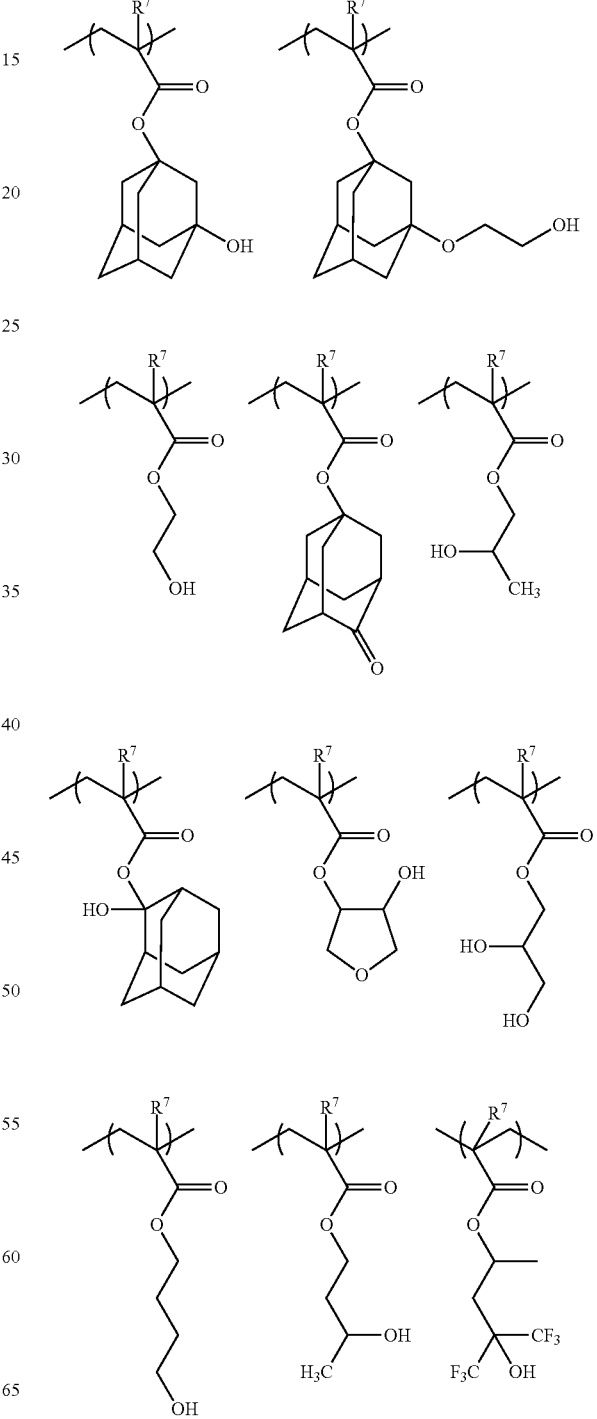

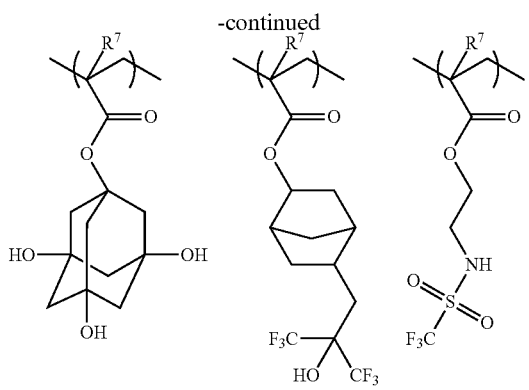

Furthermore, the resin (B) may also contain a hydrocarbon ester of a (meth)acrylic acid such as alkyl(meth)acrylate, e.g., methyl(meth)acrylate, ethyl(meth)acrylate, butyl(meth)acrylate, lauryl(meth)acrylate, cyclohexyl(meth)acrylate, (meth)acrylic acid-bicyclo[2.2.1]heptyl ester, (meth)acrylic acid-cyclohexyl ester, (meth)acrylic acid-bicyclo[4.4.0]decanyl ester, (meth)acrylic acid-bicyclo[2.2.2]octyl ester, (meth)acrylic acid-tricyclo[5.2.1.0$^{2,6}$]decanyl ester, adamantyl (meth)acrylate, (meth)acrylic acid-tricyclo[3.3.1.1$^{3,7}$]decanyl ester and the like.

Also, the resin (B) may include a structure unit having a radiation-sensitive acid-generating action, i.e., an action of generating an acid upon irradiation with a radioactive ray. Specifically, the resin (B) may include a structure provided by copolymerizing a (meth)acrylic ester that includes at the end a structure of sulfonium salt, iodonium salt, sulfonamide or the like having a radiation-sensitive acid-generating action. When the resin (B) having such a structure is used, the radiation-sensitive composition of the embodiment of the present invention may not include the acid generator (C).

Synthesis Method of Resin (B)

The resin (B) may be synthesized in accordance with a routine method such as radical polymerization. For example, the resin (B) is preferably synthesized by a method such as: a method of allowing for a polymerization reaction by adding a solution containing a monomer and a radical initiator dropwise to a solution containing a reaction solvent or a monomer; a method of allowing for a polymerization reaction by separately adding a solution containing a monomer, and a solution containing a radical initiator dropwise to a solution containing a reaction solvent or a monomer; a method of allowing for a polymerization reaction by separately adding a plurality of types of solutions containing each monomer, and a solution containing a radical initiator dropwise to a solution containing a reaction solvent or a monomer; or the like.

It should be noted that when the reaction is allowed by adding to a monomer solution dropwise a monomer solution, the amount of the monomer contained in the monomer solution added dropwise is preferably no less than 30% by mole, more preferably no less than 50% by mole, and still more preferably no less than 70% by mole with respect to the total amount of the monomer used in the polymerization.

The reaction temperature in these methods may be predetermined ad libitum depending on the type of the initiator. In general, the reaction temperature is 30 to 180° C., preferably 40 to 160° C., and more preferably 50 to 140° C. Time period of dropwise addition may vary depending on conditions involving the reaction temperature, the initiator type, the monomer to be reacted and the like, the time is usually 30 min to 8 hrs, preferably 45 min to 6 hrs, and more preferably 1 to 5 hrs. Also, the entire reaction time including the time period of dropwise addition may vary depending on the conditions similar to the time period of dropwise addition, and is usually 30 min to 8 hrs, preferably 45 min to 7 hrs, and more preferably 1 hour to 6 hrs.

The radical initiator which may be used in the polymerization is exemplified by a 2,2'-azobis(4-methoxy-2,4-dimethylvaleronitrile), 2,2'-azobis(2-cyclopropylpropionitrile), 2,2'-azobis(2,4-dimethylvaleronitrile) and the like. These initiators may be used either alone, or as a mixture of two or more thereof.

As a polymerization solvent, any solvent may be used as long as it is other than solvents that inhibit polymerization (nitrobenzene having a polymerization inhibitory effect, a mercapto compound having a chain transfer effect, etc.), and it can dissolve the monomer. For example, alcohols, ethers, ketones, amides, ester lactones, nitriles and mixed solvents thereof, and the like may be included. These solvents may be used either alone, or as a mixture of two or more thereof.

The resin obtained by the polymerization reaction is preferably recovered by a reprecipitation method. More specifically, after completing the polymerization reaction, the polymerization solution is charged into a reprecipitation solvent to recover the intended resin in the form of powder. As the reprecipitation solvent, the solvents exemplified as the polymerization solvent may be used either alone, or as a mixture of two or more thereof. As an alternative to the reprecipitation method, the resin can be also recovered by a liquid separation operation to remove small-molecule components such as monomer and oligomer. More specifically, after completing the polymerization reaction, the polymerization solution is appropriately concentrated, and thereto is added a solvent system such as e.g., methanol/heptane, selected for separating into two liquids to remove the small-molecule components from the resin solution and appropriately substitute for a necessary solvent system (propylene glycol monomethyl ether, etc.), whereby the intended resin is recovered in the form of a solution.

Although the polystyrene equivalent weight average molecular weight as determined by gel permeation chromatography (GPC) (hereinafter, referred to as "Mw") of the resin (B) is not particularly limited, it is preferably 1,000 to 100,000, more preferably 1,000 to 30,000, and particularly preferably 1,000 to 20,000. The Mw of the resin (B) of less than 1,000 tends to result in deteriorated heat resistance when prepared into a resist. On the other hand, the Mw of the resin (B) exceeding 100,000 is likely to result in deteriorated developability when prepared into a resist.

Furthermore, the ratio (Mw/Mn) of the Mw with respect to the polystyrene equivalent number average molecular weight as determined by gel permeation chromatography (GPC) (hereinafter, may be also referred to as "Mn") of the resin (B) is preferably 1.0 to 5.0, more preferably 1.0 to 3.0, and particularly preferably 1.0 to 2.0.

In the radiation-sensitive resin composition of the embodiment of the present invention, the resin (B) may be used either alone or as a mixture of two or more thereof.

<(C) Acid Generator>

It is preferred that the radiation-sensitive resin composition of the embodiment of the present invention further contain (C) an acid generator. Examples of the acid generator (C) include onium salts such as sulfonium salts and iodonium salts, organic halogen compounds, sulfone compounds such as disulfones and diazomethanesulfones, and the like.

Specific examples of preferable acid generator (C) include:

triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate and triphenylsulfonium camphorsulfonate;

4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate and 4-cyclohexylphenyldiphenylsulfonium camphorsulfonate;

4-methanesulfonylphenyldiphenylsulfonium salt compounds such as 4-methane sulfonylphenyldiphenylsulfonium trifluoromethanesulfonate, 4-methane sulfonylphenyldiphenylsulfonium nonafluoro-n-butanesulfonate, 4-methane sulfonylphenyldiphenylsulfonium perfluoro-n-octanesulfonate, 4-methane sulfonylphenyldiphenylsulfonium 2-bicyclo[2.2.1]hept-2-yl-1,1,2,2-tetrafluoroethanesulfonate and 4-methanesulfonylphenyldiphenylsulfonium camphorsulfonate;

diphenyl iodonium salt compounds such as diphenyliodonium trifluoromethanesulfonate, diphenyliodonium nonafluoro-n-butanesulfonate, diphenyliodonium perfluoro-n-octanesulfonate and diphenyliodonium 2-bicyclo[2.2.1]hept-2-yl-1,1,2,2-tetrafluoroethanesulfonate and diphenyliodonium camphorsulfonate;

bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate and bis(4-t-butylphenyl)iodonium camphorsulfonate;

1-(4-n-butoxynaphthalene-1-yl)tetrahydrothiophenium salt compounds such as 1-(4-n-butoxynaphthalene-1-yl)tetrahydrothiophenium trifluoromethanesulfonate, 1-(4-n-butoxynaphthalene-1-yl)tetrahydrothiophenium nonafluoro-n-butanesulfonate, 1-(4-n-butoxynaphthalene-1-yl)tetrahydrothiophenium perfluoro-n-octanesulfonate, 1-(4-n-butoxynaphthalene-1-yl)tetrahydrothiophenium 2-bicyclo[2.2.1]hept-2-yl-1,1,2,2-tetrafluoroethanesulfonate and 1-(4-n-butoxynaphthalene-1-yl)tetrahydrothiophenium camphorsulfonate;

1-(4-n-butoxynaphthalene-1-yl)tetrahydrothiophenium salt compounds such as 1-(6-n-butoxynaphthalene-2-yl)tetrahydrothiophenium trifluoromethanesulfonate, 1-(6-n-butoxynaphthalene-2-yl)tetrahydrothiophenium nonafluoro-n-butanesulfonate, 1-(6-n-butoxynaphthalene-2-yl)tetrahydrothiophenium perfluoro-n-octanesulfonate, 1-(6-n-butoxynaphthalene-2-yl)tetrahydrothiophenium 2-bicyclo[2.2.1]hept-2-yl-1,1,2,2-tetrafluoroethanesulfonate and 1-(6-n-butoxynaphthalene-2-yl)tetrahydrothiophenium camphorsulfonate;

1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate and 1-(3,5-dimethyl-4-hydroxyphenyl)tetrahydrothiophenium camphorsulfonate;

bicyclo[2.2.1]hept-5-ene-2,3-dicarboxyimides compounds such as N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyl oxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethane sulfonyloxy)bicyclo[2.2.1]hept-5-ene-2,3-dicarboxyimide and N-(camphorsulfonyloxy)bicyclo[2.2.1]hept-5-ene-2,3-dicarboxyimide, and the like.

The acid generator (C) may be used either alone, or as a mixture of two or more thereof. The amount of the acid generator (C) included is, in light of securement of the sensitivity and developability as a resist, preferably 0.1 to 30 parts by mass, and more preferably 0.1 to 20 parts by mass with respect to 100 parts by mass of the resin (B). In this case, the amount of the acid generator included being less than 0.1 parts by mass tends to result in deteriorated sensitivity and developability. On the other hand, the amount exceeding 30 parts by mass leads to reduced transparency for the radioactive ray, and thus tend to results in failure in obtaining a rectangular resist pattern.

<(D) Solvent>

The radiation-sensitive resin composition of the embodiment of the present invention usually contains (D) a solvent. The solvent employed is not particularly limited as long as it can dissolve at least the compound (A), the resin (B), the acid generator (C) that is a suitable component, and other optional component which may be added as desired.

For example, any one of alcohols, ethers, ketones, amides, esters, lactones, nitriles, mixed solvents thereof may be used. Of these, esters, lactones, and ketones are preferred. Preferable esters include propylene glycol monoalkyl ether acetates, 2-hydroxypropionic acid alkyls and 3-alkoxypropionic acid alkyls. Of these, propylene glycol monomethyl ether acetate is particularly preferred. Among the lactones, γ-butyrolactone and the like are preferred. These solvent may be used either alone, or as a mixture of two or more thereof.

<Other Optional Component>

Other optional components such as a fluorine-containing resin, an alicyclic skeleton-containing compound, a surfactant, and a sensitizer may be included as needed in the radiation-sensitive resin composition of the embodiment of the present invention. The amount of the other optional component included may be predetermined ad libitum to meet the intended object.

(Fluorine-Containing Resin)

The fluorine-containing resin has an effect of providing water repellency to the surface of the resist film particularly in liquid immersion lithography. Thus, it serves in inhibiting elution of components from the resist film to the liquid immersion liquid, thereby preventing droplets from remaining even if liquid immersion lithography is carried out by fast scanning, and as a result, it achieves an affect of suppressing defects derived from liquid immersion such as water mark and the like.

The structure of the fluorine-containing resin is not particularly limited as long as it has a fluorine-containing structure unit, and may include: (1) a fluorine-containing resin which is insoluble in a developing solution per se and will be alkali soluble due to the action of an acid; (2) a fluorine-containing resin which is soluble in a developing solution per se and will have increased alkali solubility due to the action of an acid; (3) a fluorine-containing resin which is insoluble in a developing solution per se and will be alkali soluble due to the action of an alkali; and (4) a fluorine-containing resin which is soluble in a developing solution per se and will have increased alkali solubility due to the action of an alkali; and the like.

Examples of the fluorine-containing resin include trifluoromethyl(meth)acrylate, 2,2,2-trifluoroethyl(meth)acrylate, perfluoroethyl(meth)acrylate and the like.

Also, as the fluorine-containing resin, for example, a copolymer or the like is preferred having the aforementioned fluorine-containing structure unit, and the structure unit (I) having the aforementioned acid-dissociable group as a structure unit that constitutes the resin (B). The fluorine-containing resin may be used either alone, or as a mixture of two or more thereof.

(Alicyclic Skeleton-Containing Compound)

The alicyclic skeleton-containing compound is a compound which exhibits actions of further improving dry etching resistance, pattern configuration, adhesiveness with the substrate, and the like.

Examples of the alicyclic skeleton-containing compound include adamantane derivatives such as 1-adamantanecarboxylate, 2-adamantanone and t-butyl 1-adamantanecarboxylate; deoxycholic acid esters such as t-butyl deoxycholate, t-butoxycarbonylmethyl deoxycholate and 2-ethoxyethyl deoxycholate; lithocholic acid esters such as t-butyl lithocholate, t-butoxycarbonylmethyl lithocholate and 2-ethoxyethyl lithocholate, and the like. Among all, 3-[2-hydroxy-2,2-bis(trifluoromethyl)ethyl]tetracyclo[4.4.0.1$^{2,5}$.1$^{7,10}$]dodecane, or 2-hydroxy-9-methoxycarbonyl-5-oxo-4-oxa-tricyclo[4.2.1.0$^{3,7}$]nonane is preferred. The alicyclic skeleton-containing compound may be used either alone, or as a mixture of two or more thereof.

(Surfactant)

The surfactant is a component that has an effect of improving coating properties, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, as well as all trade names KP341 (manufactured by Shin-Etsu Chemical Co., Ltd.), Polyflow No. 75 and Polyflow No. 95 (manufactured by Kyoeisha Chemical Co., Ltd.), EFTOP EF301, EFTOP EF303 and EFTOP EF352 (manufactured by Tochem Products Corporation), Megaface® F171 and Megaface® F173 (manufactured by Dainippon Ink And Chemicals, Incorporated), Fluorad™ FC430 and Fluorad™ FC431 (manufactured by Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (manufactured by Asahi Glass Co., Ltd.), and the like. These surfactants may be used either alone, or as a mixture of two or more thereof.

(Sensitizer)

The sensitizer serves in absorbing the energy of radioactive rays, and transferring the energy to the acid generator (C), thereby increasing the amount of acid generation, and thus has an effect of improving "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, phenothiazines, and the like. These sensitizers may be used either alone, or as a mixture of two or more thereof.

As the other additive, a dye, a pigment, an adhesion promoter and the like may be also used. By using, for example, a dye or pigment, a latent image of the light-exposed site is visualized, whereby influences of halation upon exposure can be mitigated. In addition, by including an adhesion promoter, adhesiveness with the substrate can be enhanced. Also, further examples of the other additive include in addition to the foregoings, an alkali soluble resin, a low molecular alkali solubility controlling agent having an acid dissociable protecting group, a halation inhibitor, a storage stabilizing agent, a defoaming agent, and the like.

It is to be noted that as the additive, various types of the additives described above may be used either alone, or in combination of two or more thereof.

<Preparation Method of Radiation-Sensitive Resin Composition>

The radiation-sensitive resin composition is prepared by homogenously mixing in the solvent (D) the compound (A) and the resin (B), as well as the acid generator (C) that is a suitable component, other optional component which may be optionally added, and the like. In general, the radiation-sensitive resin composition is prepared and used in the state of being dissolved or dispersed in the aforementioned solvent. For example, the radiation-sensitive resin composition in a solution or dispersion liquid state may be prepared by mixing the compound (A), the resin (B), acid generator that is a suitable component, and the other optional component at a certain ratio in the solvent (D).

<Method for Forming Photoresist Pattern>

The radiation-sensitive resin composition of the embodiment of the present invention is useful as a chemically amplified resist. In a chemically amplified resist, due to an action of the acid generated from an acid generator upon exposure, a resin component, predominantly an acid-dissociable group in the resin (B) is dissociated to generate a carboxyl group. As a result, solubility of the resist at light-exposed sites in an alkaline developer increases, whereby the light-exposed sites are dissolves in the alkaline developer and removed. Accordingly, a photoresist pattern of positive type is obtained.

A photoresist pattern may be formed, for example, as shown in the following.

A photoresist pattern can be formed by: forming a photoresist film on a substrate using the radiation-sensitive resin composition (step 1); exposing the formed photoresist film by irradiating with a radioactive ray through a mask having a predetermined pattern, via a liquid immersion medium as needed (step 2); heating (step 3); and then developing (step 4).

In the step 1, the radiation-sensitive resin composition, or a composition solution obtained by dissolving the same in a solvent is applied on a substrate (e.g., silicon wafer, wafer coated with silicon dioxide or an antireflection film, or the like) by an appropriate means for application such as spin-coating, cast coating, roll coating. This step is regulated such that a resulting resist film has a predetermined film thickness. Thereafter, the solvent in the coating film is evaporated by prebaking (PB) to form a resist film.

In the step 2, the photoresist film formed in the step 1 is exposed by irradiating with a radioactive ray, via a liquid immersion medium such as water as needed. In this step, the radioactive ray is irradiated through a mask having a predetermined pattern. The radioactive ray appropriately selected from visible light rays, ultraviolet rays, deep ultraviolet rays, X-ray, charged particle ray and the like in accordance with the line width of the intended pattern may be irradiated. The radioactive ray is preferably far ultraviolet rays typified by ArF excimer laser light (wavelength: 193 nm) and KrF excimer laser light (wavelength: 248 nm) are preferred, and in particular, ArF excimer laser light is preferred.

The step 3 is referred to as "post exposure baking (PEB)", in which the acid generated from acid generator deprotects a polymer at sites of the photoresist film exposed in the step (2). There arises the difference between the solubility of portions which were exposed (light-exposed site) and that of portions which were not exposed (light-unexposed site) in an alkaline developer. PEB is performed at an appropriately selected temperature from the range of usually 50° C. to 180° C.

In the step 4, the exposed photoresist film is developed with a developing solution to form a predetermined photoresist pattern. After the development, the film is, in general, washed with water, and then dried. The developing solution is preferably an alkali aqueous solution prepared by dissolving at least one of alkaline compounds such as, for example, sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene.

Alternatively, when liquid immersion lithography is carried out, a protective film for liquid immersion that is insoluble in the immersion liquid may be provided on the resist film prior to the step 2 so as to protect the resist film from being brought into direct contact with the immersion liquid. Anyone of a protective film removable with solvent, the film being to be removed by a solvent prior to the step 4 (for example, see JP-A No. 2006-227632), and a protective film removable with developing solution, the film being to be removed during the development in the step 4 (for example, see PCT International Publication Nos. WO 2005-069076 and WO 2006-035790) may be used as the protective film for liquid immersion. In light of throughput, a protective film for liquid immersion removable with developing solution is preferred.

EXAMPLES

Hereinafter, embodiments of the present invention are more specifically described by way of Examples. However, these Examples should not be construed as in anyway limiting the present invention. Herein, the "part" is on mass basis unless otherwise stated particularly. Each of measurement and evaluation in Examples and Comparative Examples was conducted according to the following procedure. Polystyrene Equivalent Weight Average Molecular Weight (Mw)

Mw was measured by gel permeation chromatography (GPC) using GPC columns manufactured by Tosoh Corporation (G2000HXL×2, G3000HXL×1, G4000HXL×1) under analysis conditions including a flow rate of 1.0 mL/min, an elution solvent of tetrahydrofuran, a column temperature of 40° C., with mono-disperse polystyrene as a standard.
Polystyrene Equivalent Number Average Molecular Weight (Mn)

Mn was measured by gel permeation chromatography (GPC) using GPC columns manufactured by Tosoh Corporation (G2000HXL×2, G3000HXL×1, G4000HXL×1) under analysis conditions including a flow rate of 1.0 mL/min, an elution solvent of tetrahydrofuran, a column temperature of 40° C., with mono-disperse polystyrene as a standard.

$^{13}$C-NMR Analysis $^{13}$C-NMR analysis of each polymer was carried out for determination using a nuclear magnetic resonance equipment (trade name: JNM-ECX400, manufactured by JEOL Ltd.).

Synthesis of Resin (B)

Resin (B-1) was synthesized in each Synthesis Example using the following monomers (M-1) to (M-3).

(M-1): 1-methylcyclopentyl methacrylate
(M-2): 1-ethyladamantyl methacrylate
(M-3): 4-oxa-5-oxotricyclo[4.2.1.0$^{3,7}$]nonane-2-yl methacrylate Synthesis Example 1

Resin (B-1)

A monomer solution was provided by dissolving 14.20 g (35% by mole) of the monomer (M-1), 8.99 g (15% by mole) of the monomer (M-2), and 26.81 g (50% by mole) of the monomer (M-3) in 100 g of 2-butanone, and further adding thereto 2.78 g of dimethyl 2,2'-azobis(2-methylpropionate) as an initiator.

Next, a 500 mL three-neck flask equipped with a thermometer and a dropping funnel was charged with 50 g of 2-butanone, and purged with nitrogen for 30 min. After the nitrogen purge, the interior of the flask was heated to 80° C. while stirring with a magnetic stirrer. The monomer solution which had been prepared beforehand was added dropwise using a dropping funnel over 3 hrs. The polymerization reaction was allowed for 6 hrs from the time point of initiation of addition of the monomer solution as the polymerization start time. After completion of the polymerization, the polymer solution was cooled with water to no higher than 30° C. After cooling, the polymer solution was added to 1,000 g of hexane, the deposited white powder was filtered off. The white powder thus filtered off was dissolved again in 200 g of 2-butanone, and added to 1,000 g of hexane, followed by filtering off the white powder thus deposited. Again, a similar operation was carried out. Thereafter, the white powder obtained by filtering off was dried at 50° C. for 17 hrs to obtain a white powdery copolymer (38 g, yield: 75%). This copolymer was designated as resin (B-1).

This copolymer had Mw of 6,520, and Mw/Mn of 1.61. As a result of $^{13}$C-NMR analysis, the content (% by mole) of each of structure units derived from the monomer (M-1), the monomer (M-2) and the monomer (M-3) was 35.5:15.3:49.2.
<Preparation of Radiation-Sensitive Resin Composition>

Table 1 shows formulations of the radiation-sensitive resin compositions prepared in Example and Comparative Example. In addition, each of the components ((A) component, (C) acid generator and (D) solvent) for constituting the radiation-sensitive resin composition, other than the resin (B-1) synthesized in the foregoing Synthesis Example is shown below.
(A) Component;
   (A-1): 4-hydroxy-1,2,2,6,6-pentamethylpiperidine (manufactured by Aldrich Co.)
   (a-1): bis(1,2,2,6,6-pentamethyl-4-piperidyl)sebacate (trade name: Sanol LS-765 (manufactured by Sankyo Co., Ltd.)
(C) Acid Generator;
   (C-1): triphenylsulfonium 2-bicyclo[2.2.1]hept-2-yl-1,1-difluoroethanesulfonate
(D) Solvent;
   (D-1): propylene glycol monomethyl ether acetate,
   (D-2): cyclohexanone,
   (D-3): γ-butyrolactone Example 1

The radiation-sensitive resin composition of the embodiment of the present invention was prepared by: mixing 0.7 parts by mass of the compound (A-1), 100 parts by mass of the resin (B-1) obtained in Synthesis Example 1, and 7.5 parts by mass of the acid generator (C-1); adding to the mixture 1,650 parts by mass of propylene glycol monomethyl ether acetate, 700 parts by mass of cyclohexanone and 30 parts by mass of γ-butyrolactone; allowing for dissolution of the mixture to give a mixed solution; and filtering thus resulting mixed solution through a filter having a pore size of 0.20 μm.

Comparative Example 1

A radiation-sensitive resin composition was obtained in a similar manner to Example except that the formulation of each component for preparing the radiation-sensitive resin composition was as show in Table 1.

TABLE 1

|  | (A) Compound | | (B) Resin Type | (C) Photo Acid Generator | | (D) Solvent | |
| --- | --- | --- | --- | --- | --- | --- | --- |
|  | Type | parts by mass |  | Type | parts by mass | Type | parts by mass |
| Example 1 | A-1 | 0.7 | B-1 | C-1 | 7.5 | D-1 | 1,500 |
|  |  |  |  |  |  | D-2 | 650 |
|  |  |  |  |  |  | D-3 | 30 |
| Comparative Example 1 | a-1 | 1.7 | B-1 | C-1 | 7.5 | D-1 | 1,500 |
|  |  |  |  |  |  | D-2 | 650 |
|  |  |  |  |  |  | D-3 | 30 |

Using a light source for ArF excimer laser, sensitivity, exposure latitude (EL), and MEEF value were evaluated on the radiation-sensitive resin compositions obtained in Example 1 and Comparative Example 1 according to the following evaluation method. The results are shown in Table 2.

<Evaluation Method>
Sensitivity (unit: $mJ/cm^2$)

An underlayer antireflection film having a film thickness of 77 nm was formed on the surface of an 8 inch wafer using an agent for forming underlayer antireflective coating (trade name: ARC29A; manufactured by Nissan Chemical Industries, Ltd.). On the surface of this substrate was applied the radiation-sensitive resin composition of Example or Comparative Example by spin coating, and SB (Soft Baking) was carried out on a hot plate at 100° C. for 60 sec to form a resist film having a film thickness of 100 nm.

This resist film was exposed through a mask pattern using a full field stepper (trade name: S306C; manufactured by Nikon Corporation; numerical aperture: 0.78). Thereafter, PEB was carried out at 100° C. for 60 sec, and then the film was developed with a 2.38% by mass aqueous tetramethylammonium hydroxide solution (hereinafter, referred to as "aqueous TMAH solution") at 25° C. for 30 sec, washed with water and dried to form a positive type resist pattern.

In this procedure, the exposure dose ($mJ/cm^2$) at which the line width formed through the mask for a dimension of 90 nm with line-and-space of 1:1 resulted in formation of line-and-space of 1:1 with a line width of 90 nm was defined as an optimal exposure dose, and this optimal exposure dose ($mJ/cm^2$) was designated as "sensitivity". For line-width measurement, a scanning electron microscope (trade name: S9260; manufactured by Hitachi High-Technologies Corporation) was used.

Exposure Latitude (EL)

A ratio of the optimal exposure dose with respect to the range of the exposure dose when the pattern dimension resolved with the mask pattern of 90 nm 1 L/1 S fell within the range of ±10% of the designed dimension of the mask was defined as exposure latitude. Specifically, evaluation was made to be: "favorable" when the exposure latitude was no less than 13%; and "unfavorable" when the exposure latitude was less than 13%. For the observation of the pattern dimension, the scanning electron microscope described above was used.

MEEF

Using the scanning electron microscope described above, pattern dimensions resolved with three types of mask sizes (85.0 nmL/170 nmP, 90.0 nmL/180 nmP and 95.0 nmL/190 nmP) were determined at the optimal exposure dose. The measurement results were plotted for the line width along the ordinate with respect to the mask size along the abscissa. The slope of the graph was determined according to a least squares method. This slope was designated as MEEF. Specifically, evaluation was made to be: "favorable" when MEEF was less than 1.3; and "unfavorable" when MEEF was no less than 1.3.

TABLE 2

|  | SB (° C.) | PEB (° C.) | Sensitivity ($mJ/cm^2$) | EL (%) | MEEF |
| --- | --- | --- | --- | --- | --- |
| Example 1 | 100 | 100 | 37.4 | 14.1 | 1.17 |
| Comparative Example 1 | 100 | 100 | 41.6 | 12.4 | 1.39 |

As shown in Table 2, the radiation-sensitive resin composition of Example 1 was superior in sensitivity as compared with Comparative Example 1, and favorable exposure latitude (EL) and MEEF were also exhibited.

Since the radiation-sensitive resin composition of the embodiment of the present invention is a chemically amplified radiation-sensitive composition that is superior in sensitivity, and provides satisfactory exposure latitude and MEEF performance, it can be suitably used as a lithography material for processing with light such as KrF excimer laser and ArF excimer laser. In addition, the radiation-sensitive resin composition of the embodiment of the present invention is also applicable to liquid immersion lithography satisfactorily.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:

a compound represented by a following formula (1);

a resin component comprising:

a base resin having an acid-dissociable group, being insoluble or hardly soluble in an alkali, and being soluble in an alkali in a state where the acid-dissociable group is dissociated; and optionally, a radiation sensitive acid generator which is at least one selected from the group consisting of an onium salt, an organic halogen compound, and a sulfone compound,

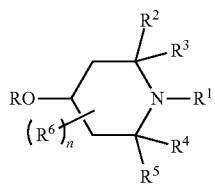

(1)

wherein, in the formula (1),
R represents a hydrogen atom or a hydrocarbon group having 1 to 20 carbon atoms,
$R^1$ represents a hydrocarbon group having 1 to 20 carbon atoms, and optionally an ester bond or an ether bond is included in a skeleton chain of the hydrocarbon group,
$R^2$ to $R^5$ each independently represent an alkyl group having 1 to 4 carbon atoms or an alicyclic hydrocarbon group having 4 to 20 carbon atoms,
$R^6$ represents a halogen atom or a hydrocarbon group having 1 to 6 carbon atoms,
n is an integer of 0 to 4, and
in a case where n is an integer of 2 to 4, $R^6$ present in a plurality of numbers are each a same or different.

2. The radiation-sensitive resin composition according to claim 1, wherein R in the formula (1) represents a hydrogen atom, and n is 0.

3. The radiation-sensitive resin composition according to claim 1, wherein each of $R^2$ to $R^5$ in the formula (1) represents a methyl group.

4. The radiation-sensitive resin composition according to claim 1, wherein the base resin has a structure unit (I) represented by a following formula (2),

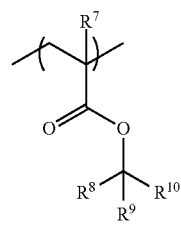

(2)

wherein, in the formula (2),
$R^7$ represents a hydrogen atom or a methyl group, and
$R^8$ to $R^{10}$ each independently represent an alkyl group having 1 to 4 carbon atoms or an alicyclic hydrocarbon group having 4 to 20 carbon atoms, or
$R^8$ represents an alkyl group having 1 to 4 carbon atoms or an alicyclic hydrocarbon group having 4 to 20 carbon atoms, and $R^9$ and $R^{10}$ bind with each other to form a bivalent alicyclic hydrocarbon group having 4 to 20 carbon atoms together with the carbon atom to which $R^9$ and $R^{10}$ are bound.

* * * * *